US012754213B2

(12) United States Patent
Guo et al.

(10) Patent No.: US 12,754,213 B2
(45) Date of Patent: Oct. 6, 2026

(54) CURRENT MEASUREMENT DEVICE

(71) Applicant: MultiDimension Technology Co., Ltd., Zhangjiagang (CN)

(72) Inventors: Haiping Guo, Zhangjiagang (CN); Chen Song, Zhangjiagang (CN); Ye Chen, Zhangjiagang (CN); Weifeng Shen, Zhangjiagang (CN); Songsheng Xue, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 197 days.

(21) Appl. No.: 18/699,497

(22) PCT Filed: Sep. 14, 2022

(86) PCT No.: PCT/CN2022/118642

§ 371 (c)(1),
(2) Date: Apr. 8, 2024

(87) PCT Pub. No.: WO2023/056827

PCT Pub. Date: Apr. 13, 2023

(65) Prior Publication Data

US 2024/0402221 A1 Dec. 5, 2024

(30) Foreign Application Priority Data

Oct. 8, 2021 (CN) .......................... 202111172335.8

(51) Int. Cl.
*G01R 15/20* (2006.01)

(52) U.S. Cl.
CPC .................................. *G01R 15/205* (2013.01)

(58) Field of Classification Search
CPC ... G01R 15/205; G01R 17/10; G01R 19/0092
See application file for complete search history.

(56) References Cited

U.S. PATENT DOCUMENTS

2006/0087318 A1* 4/2006 Crolly .................... G01R 33/09
324/252
2018/0356448 A1* 12/2018 Saito .................... G01R 15/205
(Continued)

FOREIGN PATENT DOCUMENTS

WO WO-2014181382 A1 * 11/2014 ........... G01R 33/123

*Primary Examiner* — Dominic E Hawkins

(74) *Attorney, Agent, or Firm* — Schwegman Lundberg & Woessner, P.A.

(57) ABSTRACT

A current measurement device, comprising three or more different positions, wherein each position has at least two magnetoresistances. The two magnetoresistances are two magnetoresistances which respectively have a first sensitive direction and an opposite second sensitive direction. Within a set range, the resistance value of the magnetoresistance has a linear relationship with a magnetic field at the position where the magnetoresistance is located. The sensitive directions of all magnetoresistances at different positions are the same or opposite. A magnetic field to be measured has a component in the sensitive direction of the magnetoresistance. At least at one position the component in the sensitive direction of said magnetic field is different from components in the sensitive direction of said magnetic fields at other positions. All the magnetoresistances are electrically connected to form a resistance network in which an output signal includes the signals of said magnetic fields, and does not include or includes an interference magnetic field signal that is less than a first preset intensity. The current measurement device eliminates the interference of an interference magnetic field with current measurement.

10 Claims, 5 Drawing Sheets

(56) References Cited

U.S. PATENT DOCUMENTS

| | | | | |
|---|---|---|---|---|
| 2019/0011287 | A1* | 1/2019 | Schmitt .............. | G01R 33/0082 |
| 2019/0018072 | A1* | 1/2019 | Yuan .................. | G01R 33/0011 |
| 2019/0219616 | A1* | 7/2019 | Cadugan ............ | G01R 19/0092 |
| 2024/0044945 | A1* | 2/2024 | Yuan .................... | G01R 15/205 |

* cited by examiner

CURRENT MEASUREMENT DEVICE

PRIORITY CLAIM TO RELATED APPLICATIONS

This application is a U.S. national stage filing under 35 U.S.C. § 371 from International Application No. PCT/CN2022/118642, filed on 14 Sep. 2022, and published as WO2023/056827 on 13 Apr. 2023, which claims the benefit under 35 U.S.C. 119 to Chinese Application No. 202111172335.8, filed on 8 Oct. 2021, the benefit of priority of each of which is claimed herein, and which applications and publication are hereby incorporated herein by reference in their entirety.

TECHNICAL FIELD

Embodiments of the present invention relate to the technical field of magnetic sensors, and in particular, to an electrical current measurement device.

BACKGROUND

Current measurement has always been a common and important demand in power systems, wind power, photovoltaics, frequency converters, rail transit, industrial control and other industries. Nowadays, with the booming development of artificial intelligence and Smart Internet of Things, the demand for current measurement is increasing significantly, while higher challenges are posed to the performance parameters of the current measurement module.

A current sensor detects the magnitude of the current to be measured by detecting the magnitude of the magnetic field generated by the current. However, there are often interference magnetic fields in the environment, which causes low sensitivity and unstable performance of the current sensor. In order to reduce the influence of the interference magnetic fields, magnetic shielding can be used to improve detection accuracy. An embodiment of the current sensor is proposed in the patent application CN109313223A, titled "ELECTRICAL CURRENT SENSOR", which includes at least two magnetic shields around the magnetic detection element configured in a manner to sandwich the magnetic detection element and the current path, thereby shielding the influence of the external magnetic flux on the magnetic detection element. The patent application CN111308154A, titled "ELECTRICAL CURRENT SENSOR", includes two sensors in different physical positions. The processing circuit is connected to the magnetic sensor and determines the current based on the difference between the signals of the two sensors, making the current sensor insensitive to external interference fields.

Magnetic shielding tends to increase the size of the sensor, and sensor configuration and circuit processing also introduce multiple additional components, both of which complicate the test system and increase costs. Meanwhile, the above processing circuit can only handle situations in which the interference magnetic field is a uniform external field. In practical applications, however, there are often a wide variety of forms of external interference fields, especially non-uniform external fields. The interference from non-uniform external fields influences the current detection accuracy.

INVENTION SUMMARY

Embodiments of the present invention provide a current measurement device to solve the problem of existing current sensors of interference from interference magnetic fields.

Embodiments of the present invention provide a current measurement device, including N different positions, each position provided with at least two magneto-resistors, N being greater than or equal to 3.

The two magneto-resistors at the same position include a magneto-resistor with a first sensitive direction and a magneto-resistor with a second sensitive direction, the first sensitive direction and the second sensitive direction are opposite, and the resistance value of the magneto-resistor, within a set range, has a linear relationship with the magnetic field at the position where the magneto-resistor is located.

The sensitive directions of all the magneto-resistors at the N different positions are the same or opposite, and the magnetic field to be measured has a component in the sensitive direction of the magneto-resistor.

The component of the magnetic field to be measured in the sensitive direction in at least one position is different from the components of the magnetic field to be measured in the sensitive direction at other positions.

All the magneto-resistors are electrically connected to form a resistor network. An output signal of the resistor network includes the signal of the magnetic field to be measured and does or does not include an interference magnetic field signal less than a first preset intensity. The interference magnetic field signal includes a uniform interference magnetic field and a gradient interference magnetic field.

Further, the N different positions are distributed on the same straight line.

Further, the N different positions are equally spaced.

Further, the resistor network has a power supply terminal, a ground terminal and an output terminal.

Further, the structure of the resistor network includes at least two half-bridge structures. The half-bridge structure is formed by an upper bridge arm and a lower bridge arm. One terminal of the upper bridge arm is electrically connected to the power supply terminal, one terminal of the lower bridge arm is electrically connected to the ground terminal, and the other terminal of the upper bridge arm and the other terminal of the lower bridge arm are both electrically connected to the output terminal.

In any of the half-bridge structures, the magneto-resistor in the upper bridge arm includes magneto-resistors at one or more positions, and the magneto-resistors in the upper bridge arm have the same sensitive direction, and the magneto-resistor in the lower bridge arm includes magneto-resistors at one or more positions, and the magneto-resistors in the lower bridge arm have the same sensitive direction. The sensitive direction of the magneto-resistors in the upper bridge arm is different from that of the magneto-resistors in the lower bridge arm.

Further, the current measurement device also includes: a current wire that generates a magnetic field to be measured to reflect the magnitude and direction of the current in the current wire.

The structure of the resistor network is used to enable the output signal of the resistor network to include the signal of the magnetic field to be measured and not include or include an interference magnetic field signal less than the first preset intensity, so that the current measurement device reflects the magnitude and direction of the current in the current wire without being influenced by the interference magnetic field.

Further, N is 3, and the N different positions are a first position, a second position and a third position in sequence.

Some magneto-resistors at the first position and the third position are electrically connected to form an upper bridge arm of a first half-bridge structure.

The other magneto-resistors at the first position and the third position are electrically connected to form a lower bridge arm of the first half-bridge structure.

Some magneto-resistors at the second position are electrically connected to form an upper bridge arm of the second half-bridge structure.

The other magneto-resistors at the second position are electrically connected to form a lower bridge arm of the second half-bridge structure.

An output terminal signal of the first half-bridge structure and an output terminal signal of the second half-bridge structure are combined to reflect the magnitude and direction of the current in the current wire.

Further, N is 3, and the N different positions are a first position, second position and third position in sequence.

Some magneto-resistors at the first position are electrically connected to form an upper bridge arm of the first half-bridge structure.

Other magneto-resistors at the first position are electrically connected to form a lower bridge arm of the first half-bridge structure.

Some magneto-resistors at the second position are electrically connected to form an upper bridge arm of the second half-bridge structure.

The other magneto-resistors at the second position are electrically connected to form a lower bridge arm of the second half-bridge structure.

Some magneto-resistors at the third position are electrically connected to form an upper bridge arm of the third half-bridge structure.

Other magneto-resistors at the third position are electrically connected to form a lower bridge arm of the third half-bridge structure.

An output terminal signal of the first half-bridge structure, an output terminal signal of the second half-bridge structure, and an output terminal signal of the third half-bridge structure are combined to reflect the magnitude and direction of the current in the current wire.

Further, N is 4, and the N different positions are a first position, second position, third position and fourth position in sequence.

The magneto-resistors at the first position and the fourth position are electrically connected to form an upper bridge arm of the first half-bridge structure.

The magneto-resistors at the first position and the fourth position are electrically connected to form a lower bridge arm of the first half-bridge structure.

The magneto-resistors at the second position and the third position are electrically connected to form an upper bridge arm of the second half-bridge structure.

The magneto-resistors at the second position and the third position are electrically connected to form a lower bridge arm of the second half-bridge structure.

An output terminal signal of the first half-bridge structure and an output terminal signal of the second half-bridge structure are combined to reflect the magnitude and direction of the current in the current wire.

Further, the form of electrical connection in which the magneto-resistors are electrically connected to form the half-bridge structure is a series electrical connection and/or a parallel electrical connection.

In the embodiments of the present invention, the current measurement device includes N different positions, each position provided with at least two magneto-resistors, and N being greater than or equal to 3; the two magneto-resistors at the same position include a magneto-resistor with a first sensitive direction and a magneto-resistor with a second sensitive direction, the first sensitive direction and the second sensitive direction are opposite, and the resistance value of the magneto-resistor has, within a set range, a linear relationship with the magnetic field at the position where the magneto-resistor is located. The sensitive directions of all the magneto-resistors at the N different positions are the same or opposite, and the magnetic field to be measured has a component in the sensitive direction of the magneto-resistor. The component, in the sensitive direction, of the magnetic field to be measured in at least one position is different from the components, in the sensitive direction, of the magnetic field to be measured at other positions. All the magneto-resistors are electrically connected to form a resistor network. An output signal of the resistor network includes the signal of the magnetic field to be measured and does not include or includes an interference magnetic field signal less than a first preset intensity. The interference magnetic field signal includes a uniform interference magnetic field and a gradient interference magnetic field. In the embodiments of the present invention, the signal output by the current measurement device includes no or very little interference magnetic field signal, which effectively eliminates or reduces the interference of the interference magnetic field with current measurement, and achieves accurate detection of the current.

DESCRIPTION OF THE DRAWINGS

In order to more clearly illustrate the embodiments of the present invention or the technical solutions in the prior art, a brief introduction will be made below to the drawings that need to be used in the description of the embodiments or the prior art. Obviously, although the drawings in the following description depict some specific embodiments of the present invention, those skilled in the art can make expansion and extension to other structures and drawings based on the basic concepts of the device structure, driving method and manufacturing method disclosed and suggested by the various embodiments of the present invention, and these shall all fall within the scope of the claims of the present invention.

SPECIFIC EMBODIMENT METHODS

In order to achieve the objectives of this invention and make technical solutions and advantages of the present invention clearer, the technical solutions of the present invention will be clearly and completely described through the detailed description with reference to the accompanying drawings in the embodiments of the present invention. Obviously, the described embodiments are some but not all the embodiments of the present invention. Based on the basic concepts disclosed and suggested by the embodiments of the present invention, all other embodiments obtained by those skilled in the art fall within the scope of protection of the present invention.

Figure 1:
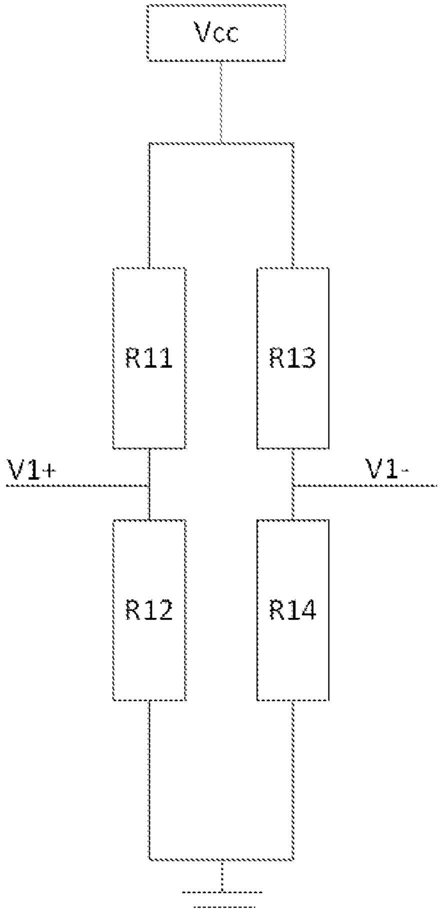
FIG. 1 is a schematic diagram of the connection between magneto-resistors in an existing current sensor.

Refer to FIG. 1, which is a schematic diagram of the connection between magneto-resistors in an existing current sensor. Optionally, the current sensor is a linear current sensor for current measurement. As shown in FIG. 1, the current sensor includes at least two half-bridges. One half-bridge includes magneto-resistors R11 and R12, and the other half-bridge includes magneto-resistors R13 and R14. The sensitive directions of magneto-resistors located on the same half-bridge are opposite, and the sensitive directions of magneto-resistors located diagonally on different half-bridges are the same. Obviously, the sensitive directions of the magneto-resistors R11 and R12 are opposite, and the sensitive directions of R13 and R14 are opposite; and the sensitive directions of the magneto-resistors R11 and R14 are the same, and the sensitive directions of R13 and R12 are the same.

The current sensor measures current using Biot-Savart's law. Generally speaking, when the current of an energized straight wire is I, the magnetic field intensity at a vertical distance r from the wire is H, that is, H=I/(2πr). The magneto-resistor in the current sensor is designed through process so that its resistance value is, within a certain range, positively correlated with the intensity of the magnetic field at the position where the magneto-resistor is located. As the sensitive axes of the magneto-resistors R11 and R12 on the same half-bridge are in opposite directions, the resistance values of the two magneto-resistors at the distance r can be calculated respectively as:

$$R11 = R0 - kH = R0 - kI/(2\pi r), \text{ and}$$

$$R12 = R0 + kH = R0 + kI/(2\pi r),$$

where R0 is the resistance value of the magneto-resistor in the absence of a magnetic field, and k is a constant.

At this time, the full-bridge signal output value Vf of the current sensor can be calculated as:

$$Vf = \left(\frac{R12}{R11+R12} - \frac{R11}{R11+R12}\right)\times Vcc = \left(\frac{R0+\frac{kI}{2\pi r}}{2R0} - \frac{R0-\frac{kI}{2\pi r}}{2R0}\right)\times Vcc = \frac{kI}{2R0\pi r}\times Vcc,$$

where Vcc is the supply voltage. Obviously, it can be known from the formula of the output signal Vf that the output signal Vf of the current sensor is positively correlated with the current I of the energized straight wire. In other words, the output signal Vf of the current sensor is positively correlated with the intensity of the magnetic field near the current sensor. Finally, the magnitude of the current intensity can be determined based on the output voltage signal.

However, in practical applications, the magnetic field signal detected by the magneto-resistor in the current sensor includes not only the induced magnetic field generated by the current, but also the interference magnetic field. Accordingly, the output signal of the current sensor also includes noise from the interference field, which influences the test accuracy. For a current sensor that includes multiple magneto-resistors, as the spacing between the magneto-resistors is relatively small, the non-uniform interference magnetic field can, within this small range, be approximately regarded as a uniformly changing linear interference field.

The current measurement device provided by the embodiments of the present invention can eliminate the error from the uniformly changing linear interference field within this small range and reduce the influence of the interference field on current measurement. In particular, embodiments of the present invention provide an anti-interference bridge structure without introducing other components, and its sensor output eliminates the influence from both the gradient interference magnetic field and the uniform interference magnetic field, improving the detection accuracy and being suitable for a variety of application scenarios. In particular, embodiments of the present invention propose a bridge structure and a current wire configuration, which can achieve accurate current measurement and eliminate the influence from the gradient interference magnetic field and the uniform interference magnetic field. The structure of the current measurement device and the anti-interference bridge structure therein will be described in detail below.

Figure 2:
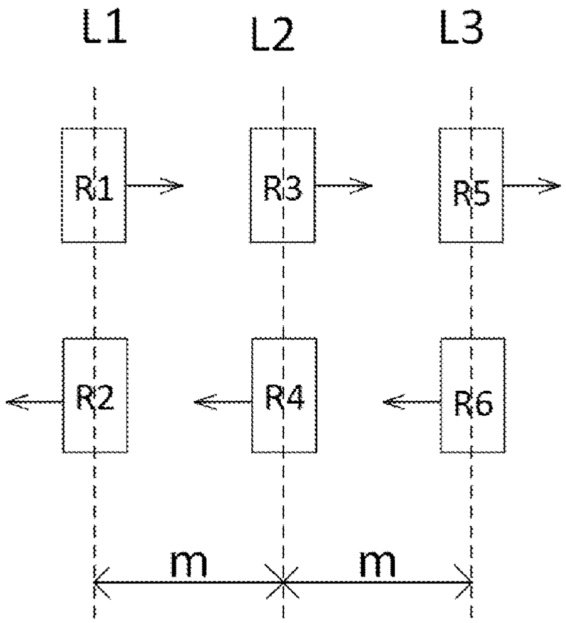
FIG. 2 is a schematic diagram of the positions of magneto-resistors in a current measurement device provided by an embodiment of the present invention.

Refer to FIG. 2, which is a schematic diagram of the positions of magneto-resistors in a current measurement device provided by an embodiment of the present invention. The current measurement device provided by this embodiment includes N different positions, each position provided with at least two magneto-resistors, N being greater than or equal to 3. The two magneto-resistors at the same position include a magneto-resistor with a first sensitive direction and a magneto-resistor with a second sensitive direction, the first sensitive direction and the second sensitive direction are opposite, and the resistance value of the magneto-resistor has, within a set range, a linear relationship with the magnetic field at the position where the magneto-resistor is located. The sensitive directions of all the magneto-resistors at the N different positions are the same or opposite, and the magnetic field to be measured has a component in the sensitive direction of the magneto-resistor. The component, in the sensitive direction, of the magnetic field to be measured in at least one position is different from the components, in the sensitive direction, of the magnetic field to be measured at other positions. All the magneto-resistors are electrically connected to form a resistor network. An output signal of the resistor network includes the signal of the magnetic field to be measured and does not include or includes an interference magnetic field signal less than a first preset intensity. The interference magnetic field signal includes a uniform interference magnetic field and a gradient interference magnetic field.

In this embodiment, the current measurement device includes at least 3 different positions, each position provided with at least two magneto-resistors, N being greater than or equal to 3. The two magneto-resistors at the same position include a magneto-resistor with a first sensitive direction and a magneto-resistor with a second sensitive direction, the first sensitive direction and the second sensitive direction are opposite, and the resistance value of the magneto-resistor has, within a set range, a linear relationship with the magnetic field at the position where the magneto-resistor is located. It can be understood that the same position of the current measurement device means that the magnetic field generated by the current at that position is the same.

Optionally, N=3, then the three different positions of the current measurement device can be denoted as L1, L2 and L3 in sequence. The position L1 is provided with at least two magneto-resistors R1 and R2, the position L2 is provided with at least two magneto-resistors R3 and R4, and the position L3 is provided with at least two magneto-resistors R5 and R5. That is, the magnetic field generated by the current at the position L1 is the same, the magnetic field generated by the current at the position L2 is the same, the magnetic field generated by the current at the position L3 is the same, and the magnetic fields generated by the current at different positions are different. The sensitive directions of the magneto-resistors R1 and R2 located at the same position are opposite, the sensitive directions of the magneto-resistors R3 and R4 located at the same position are opposite, and the sensitive directions of the magneto-resistors R5 and R6 located at the same position are opposite. The physical locations and reference directions of the magneto-resistors in the current measurement device are shown in FIG. 2.

Optionally, the spacing between adjacent positions are the same, then the spacing between L1 and L2 and the spacing between L2 and L3 are the same, and the spacings are both m.

The sensitive directions of all the magneto-resistors at the N different positions are the same or opposite. For example, the sensitive directions of the magneto-resistors R1, R3 and R5 at the three different positions are the same, and the sensitive directions of the magneto-resistors R2, R4 and R6 at the three different positions are the same, but the sensitive directions of all the magneto-resistors are parallel to the direction of arrangement of the physical positions of the magneto-resistors. It is to be noted that, in actual design, the sensitive directions of all the magneto-resistors and the directions of arrangement of the physical positions of the magneto-resistors may not be parallel, but rather intersect with each other.

The magnetic field to be measured is generated after the current flows into the current measurement device. The magnetic field to be measured has a component in the sensitive direction of each magneto-resistor. It is known that the magnetic field generated by the current at the same position is the same and the magnetic fields generated at different positions are different, then the component, in the sensitive direction, of the magnetic field to be measured sensed in at least one position is different from the components, in the sensitive directions, of the magnetic field to be measured at other positions.

All the magneto-resistors in the current measurement device are electrically connected to form a resistor network. An output signal of the resistor network includes the signal of the magnetic field to be measured and does not include or includes an interference magnetic field signal less than a first preset intensity. The interference magnetic field signal includes a uniform interference magnetic field and a gradient interference magnetic field.

Optionally, the N different positions are distributed on the same straight line. Optionally, the N different positions are distributed to be equally spaced.

In the following, the process of eliminating or reducing the interference magnetic field by the current measurement device is explained with specific examples. Specifically, the magneto-resistors at the N different positions in the current measurement device are electrically connected to form a half-bridge structure.

Optionally, the resistor network has a supply terminal Vcc, a ground terminal and an output terminal. Optionally, the structure of the resistor network includes at least two half-bridge structures. The half-bridge structure is formed by an upper bridge arm and a lower bridge arm. One terminal of the upper bridge arm is electrically connected to the power supply terminal, one terminal of the lower bridge arm is electrically connected to the ground terminal, and the other terminal of the upper bridge arm and the other terminal of the lower bridge arm are both electrically connected to the output terminal. In any of the half-bridge structures, the magneto-resistor in the upper bridge arm includes magneto-resistors at one or more positions, and the magneto-resistors in the upper bridge arm have the same sensitive direction, and the magneto-resistor in the lower bridge arm includes magneto-resistors at one or more positions, and the magneto-resistors in the lower bridge arm have the same sensitive direction. The sensitive direction of the magneto-resistors in the upper bridge arm is different from that of the magneto-resistors in the lower bridge arm. Optionally, the form of electrical connection in which the magneto-resistors are electrically connected to form the half-bridge structure is a series electrical connection and/or a parallel electrical connection.

Optionally, the current measurement device further includes: a current wire that generates a magnetic field to be measured to reflect the magnitude and direction of the current in the current wire. The structure of the resistor network is used to enable the output signal of the resistor network to include the signal of the magnetic field to be measured and not include or include an interference magnetic field signal less than a first preset intensity, so that the current measurement device reflects the magnitude and direction of the current in the current wire without being influenced by the interference magnetic field.

Optionally, N is 3, and the N different positions are a first position L1, a second position L2 and a third position L3 in sequence. Some magneto-resistors at the first position L1 and the third position L3 are electrically connected to form an upper bridge arm of a first half-bridge structure. The other magneto-resistors at the first position L1 and the third position L3 are electrically connected to form a lower bridge arm of the first half-bridge structure. Some magneto-resistors at the second position L2 are electrically connected to form an upper bridge arm of a second half-bridge structure. The other magneto-resistors at the second position L2 are electrically connected to form a lower bridge arm of the second half-bridge structure. An output terminal signal of the first half-bridge structure and an output terminal signal of the second half-bridge structure are combined to reflect the magnitude and direction of the current in the current wire.

Figure 3:
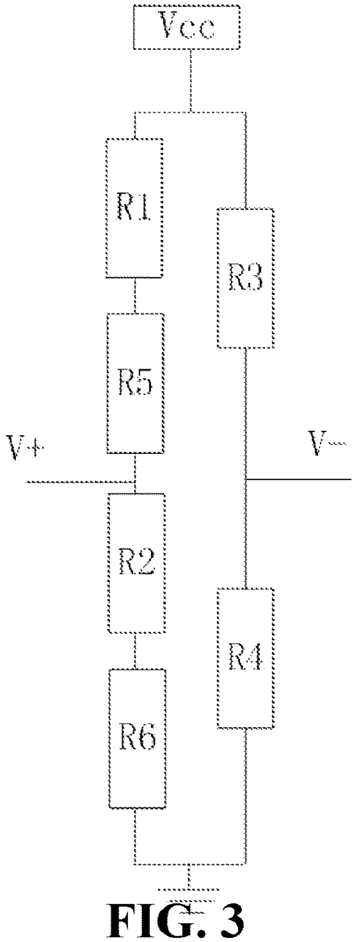
FIG. 3 is a schematic diagram of an anti-interference bridge structure in a current measurement device provided by an embodiment of the present invention.

Refer to FIG. 3, which is a schematic diagram of an anti-interference bridge structure in a current measurement device provided by an embodiment of the present invention.

As shown in FIG. 3, the resistor network has a power supply terminal Vcc, a ground terminal and an output terminal (V+ and V−). Three magneto-resistor groups, i.e., six magneto-resistors, in the current measurement device are connected to form two half-bridge structures. R1 and R5 form the upper bridge arm of the first half-bridge structure, R2 and R6 form the lower bridge arm of the first half-bridge structure, R3 forms the upper bridge arm of the second half-bridge structure, and R4 forms the lower bridge arm of the second half-bridge structure. The sensitive directions of the upper bridge arm of the first half-bridge structure and the upper bridge arm of the second half-bridge structure are the same, the sensitive directions of the lower bridge arm of the first half-bridge structure and the lower bridge arm of the second half-bridge structure are the same, and the sensitive directions of the upper bridge arm and the lower bridge arm are opposite.

Assuming that the intensity of the current flowing into the current measurement device is I, the interference field existing in the sensitive direction can be considered as a combined field of the gradient interference magnetic field Hg (magnetic field changing per unit distance) and the uniform interference magnetic field Hu. Based on this, we can obtain:

$$R1 = R0 - aI - nHu,\ R2 = R0 + aI + nHu,$$

$$R3 = R0 - bI - n\,(Hu + Hg),\ R4 = R0 + bI + n\,(Hu + Hg),$$

$$R5 = R0 - cI - n\,(Hu + 2Hg),\ R6 = R0 + cI + n\,(Hu + 2Hg),$$

where a is the sensitivity of the magneto-resistors R1 and R2 at the same position to the current intensity, b is the sensitivity of the magneto-resistors R3 and R4 at the same position to the current intensity, and c is the sensitivity of the magneto-resistors R5 and R6 at the same position to the current intensity. Due to the different positions of R1, R3, and R5, the sensitivities of the three magneto-resistor groups to the current intensity are not necessarily the same, that is, a, b, and c are not exactly the same. n is the sensitivity of the magneto-resistors to the interference magnetic field.

Based on this, the current measurement device can obtain the output signal V+ of the first half-bridge structure and the output signal v− of the second half-bridge structure, respectively as, $$V+ = \left(\frac{R2 + R6}{R1 + R2 - R5 + R6}\right) \times Vcc = \frac{2R0 + (a + c)I + n\,(2Hu + 2Hg)}{4R0} \times Vcc$$

$$V- = \frac{R4}{R3 + R4} \times Vcc = \frac{R0 + bI + n\,(Hu + Hg)}{2R0} \times Vcc.$$

as mentioned above, the output signal V+ of the first half-bridge structure and the output signal V− of the second half-bridge structure are interfered by the gradient interference magnetic field Hg and the uniform interference magnetic field Hu.

Here, a first-order differential operation is made on V+ and V− to obtain the final output signal Vout as, $$Vout = (V+) - (V-) = \frac{(a + c - 2b)I}{4R0} \times Vcc.$$

As mentioned above, the current to be measured generates a magnetic field component in the sensitive direction of the magneto-resistor. The resistance value of the magneto-resistor changes with the changes of the induced magnetic field and interference magnetic field of the current to be measured at the respective position of the magneto-resistor. A corresponding voltage signal is output through the half-bridge structure, from which the magnitude of the current can be calculated. Obviously, the final output signal Vout of the current measurement device eliminates the interference from the gradient interference magnetic field Hg and the uniform interference magnetic field Hu.

It can be understood that after all the magneto-resistors are electrically connected to form a resistor network, the output signal of the resistor network does not include interference magnetic field signal or only includes very little interference magnetic field signal. Here, the first preset intensity is a preset minimum intensity value, just to indicate that the output signal of the resistor network does not include or includes very little interference magnetic field signal. The interference magnetic field signal includes a uniform interference magnetic field and a gradient interference magnetic field.

In the other embodiments, further optionally, the sensitive directions of corresponding positions in the first and second half-bridge structures are not necessarily the same. For example, by interchanging the sensitive directions of R3 and R4, the current measurement device can obtain the output signal V+ of the first half-bridge structure and the output signal V− of the second half-bridge structure, respectively as, $$V+ = \frac{R2 + R6}{R1 + R2 + R5 + R6} \times Vcc = \frac{2R0 + (a + c)I + n\,(2Hu + 2Hg)}{4R0} \times Vcc$$

$$V- = \frac{R4}{R3 + R4} \times Vcc = \frac{R0 - bI - n\,(Hu + Hg)}{2R0} \times Vcc.$$

In this configuration, the final output signal Vout of the current measurement device is, $$Vout = (V+) + (V-) = \left[\frac{(a + c - 2b)I}{4R0} + 1\right] \times Vcc.$$

Obviously, the final output signal Vout of the current measurement device still eliminates the interference from the gradient interference magnetic field Hg and the uniform interference magnetic field Hu.

It is to be noted that, in actually designing the current measurement device, the distances between the three physical positions may be slightly different and are not limited to being equal in spacing. Those skilled in the art can reasonably design the spacing between the three physical positions, provided that the interference magnetic field can be eliminated.

In the embodiments of the present invention, the current measurement device includes N different positions, each position provided with at least two magneto-resistors, N being greater than or equal to 3. The two magneto-resistors at the same position include a magneto-resistor with a first sensitive direction and a magneto-resistor with a second sensitive direction, the first sensitive direction and the second sensitive direction are opposite, and the resistance value of the magneto-resistor has, within a set range, a linear relationship with the magnetic field at the position where the magneto-resistor is located. The sensitive directions of all the magneto-resistors at the N different positions are the same or opposite, and the magnetic field to be measured has a component in the sensitive direction of the magneto-resistor. The component, in the sensitive direction, of the magnetic field to be measured in at least one position is different from the components, in the sensitive direction, of the magnetic field to be measured at other positions. All the magneto-resistors are electrically connected to form a resistor network. An output signal of the resistor network includes the signal of the magnetic field to be measured and does not include or includes an interference magnetic field signal less than a first preset intensity. The interference magnetic field signal includes a uniform interference magnetic field and a gradient interference magnetic field. In the embodiments of the present invention, the signal output by the current measurement device includes no or very little interference magnetic field signal, which effectively eliminates or reduces the interference of the interference magnetic field with current measurement, and achieves accurate detection of the current.

As an example, unlike the above embodiment, optionally N is 3, and the N different positions are a first position, a second position and a third position in sequence. Some magneto-resistors at the first position are electrically connected to form an upper bridge arm of a first half-bridge structure. The other magneto-resistors at the first position are electrically connected to form a lower bridge arm of the first half-bridge structure. Some magneto-resistors at the second position are electrically connected to form an upper bridge arm of a second half-bridge structure. The other magneto-resistors at the second position are electrically connected to form a lower bridge arm of the second half-bridge structure. Some magneto-resistors at the third position are electrically connected to form an upper bridge arm of the third half-bridge structure. The other magneto-resistors at the third position are electrically connected to form a lower bridge arm of the third half-bridge structure. An output terminal signal of the first half-bridge structure, an output terminal signal of the second half-bridge structure and an output terminal signal of the third half-bridge structure are combined to reflect the magnitude and direction of the current in the current wire.

Figure 4:
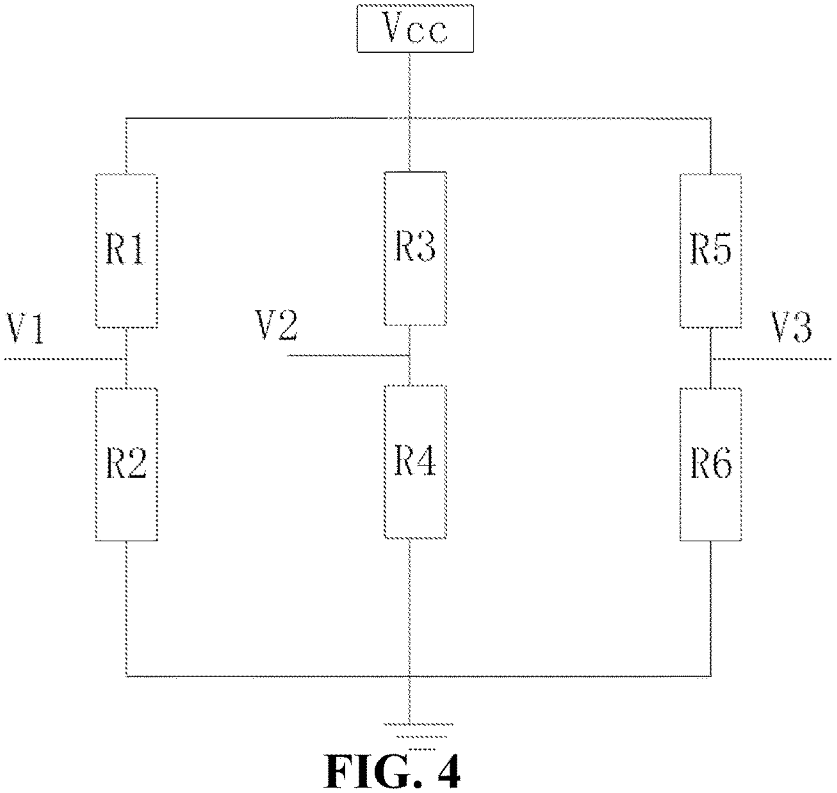
FIG. 4 is a schematic diagram of an anti-interference bridge structure in another current measurement device provided by an embodiment of the present invention.

Refer to FIG. 4, which is a schematic diagram of an anti-interference bridge structure in another current measurement device provided by an embodiment of the present invention.

As shown in FIG. 4, the resistor network has a power supply terminal Vcc, a ground terminal and an output terminal (V1, V2 and V3). The positions of the six magneto-resistors are the same as in FIG. 2, but the resistor network is formed by three half-bridge structures. Wherein, R1 and R2 form the upper and lower bridge arms of the first half-bridge structure respectively, R3 and R4 form the upper and lower bridge arms of the second half-bridge structure respectively, and R5 and R6 form the upper and lower bridge arms of the third half-bridge structure respectively. The output signal of the first half-bridge structure is V1, the output signal of the second half-bridge structure is V2, and the output signal of the third half-bridge structure is V3.

The expressions of the output signals V1, V2 and V3 of the three half-bridge structures are as follows, $$V1 = \frac{R2}{R1+R2} \times Vcc = \frac{R0 + aI + nHu}{2R0} \times Vcc$$

$$V2 = \frac{R4}{R3+R4} \times Vcc = \frac{R0 + bI + n\ (Hu + Hg)}{2R0} \times Vcc$$

$$V3 = \frac{R6}{R5+R6} \times Vcc = \frac{R0 + cI + n\ (Hu + 2Hg)}{2R0} \times Vcc.$$

Here, a first-order operation is made on V1, V2 and V3 to obtain the final output signal Vout as, $$Vout = 2V2 - (V1 + V3) = \frac{(2b - a - c)I}{2R0} \times Vcc,$$

Obviously, the final output signal Vout of the current measurement device still eliminates the interference from the gradient interference magnetic field Hg and the uniform interference magnetic field Hu.

Figure 5:
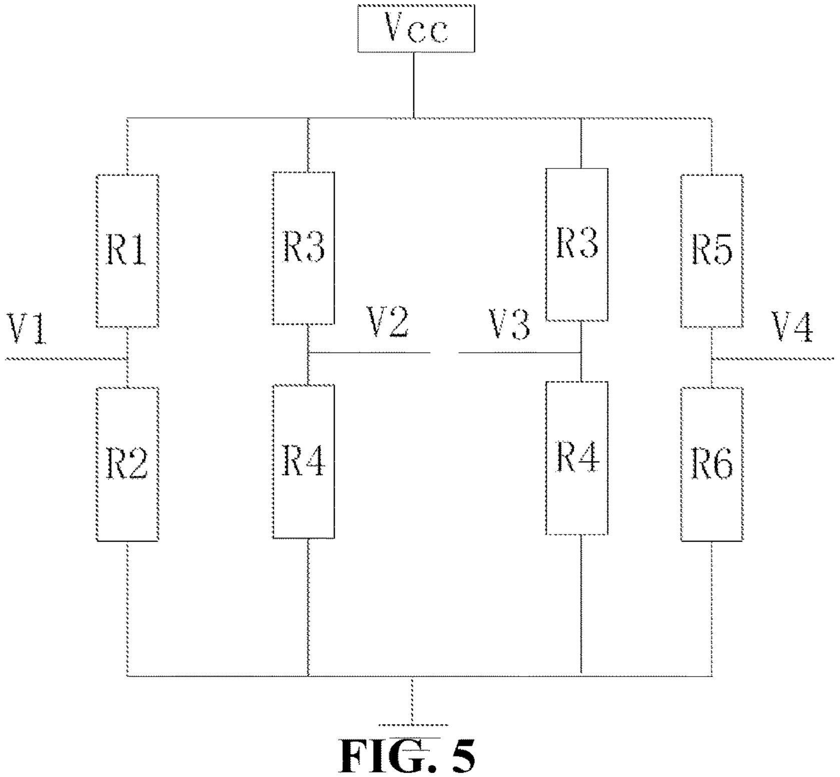
FIG. 5 is a schematic diagram of an anti-interference bridge structure in yet another current measurement device provided by an embodiment of the present invention.

Refer to FIG. 5, which is a schematic diagram of an anti-interference bridge structure in yet another current measurement device provided by an embodiment of the present invention. FIG. 5 is a variation of the three half-bridge structures in FIG. 4, in which the resistor network has a power supply terminal Vcc, a ground terminal and an output terminal (V1, V2, V3 and V4). The resistor network uses the connection pattern of the four half-bridge structures shown in FIG. 5, which is beneficial to connecting the bridge to the subsequent operational amplifier ("OP-AMP") circuit. Wherein, two identical magneto-resistors R3 and two identical magneto-resistors R4 are placed at the position L2.

Then the expressions of the output signals V1, V2, V3 and V4 of the four half-bridge structures are as follows, $$V1 = \frac{R2}{R1+R2} \times Vcc = \frac{R0 + aI + nHu}{2R0} \times Vcc$$

$$V2 = V3 = \frac{R4}{R3+R4} \times Vcc = \frac{R0 + bI + n\ (Hu + Hg)}{2R0} \times Vcc$$

$$V4 = \frac{R6}{R5+R6} \times Vcc = \frac{R0 + cI + n\ (Hu + 2Hg)}{2R0} \times Vcc.$$

The output signals of the four half-bridge structures are input to two differential operational amplifiers, and a differential operation is made on the operation results. The final output signal Vout of the current measurement device can be obtained as, $$Vout = (V2 - V1) - (V4 - V3) = \frac{(2b - a - c)I}{2R0} \times Vcc.$$

Obviously, the final output signal Vout of the current measurement device eliminates the interference from the gradient interference magnetic field Hg and the uniform interference magnetic field Hu.

As an example, unlike the above embodiment, optionally N is 4, and the N different positions are a first position, second position, third position and fourth position in sequence. The magneto-resistors at the first position and the fourth position are electrically connected to form an upper bridge arm of a first half-bridge structure. The magneto-resistors at the first position and the fourth position are electrically connected to form a lower bridge arm of the first half-bridge structure. The magneto-resistors at the second position and the third position are electrically connected to form an upper bridge arm of a second half-bridge structure. The magneto-resistors at the second position and the third position are electrically connected to form a lower bridge arm of the second half-bridge structure. An output terminal signal of the first half-bridge structure and an output terminal signal of the second half-bridge structure are combined to reflect the magnitude and direction of the current in the current wire.

Figure 6:
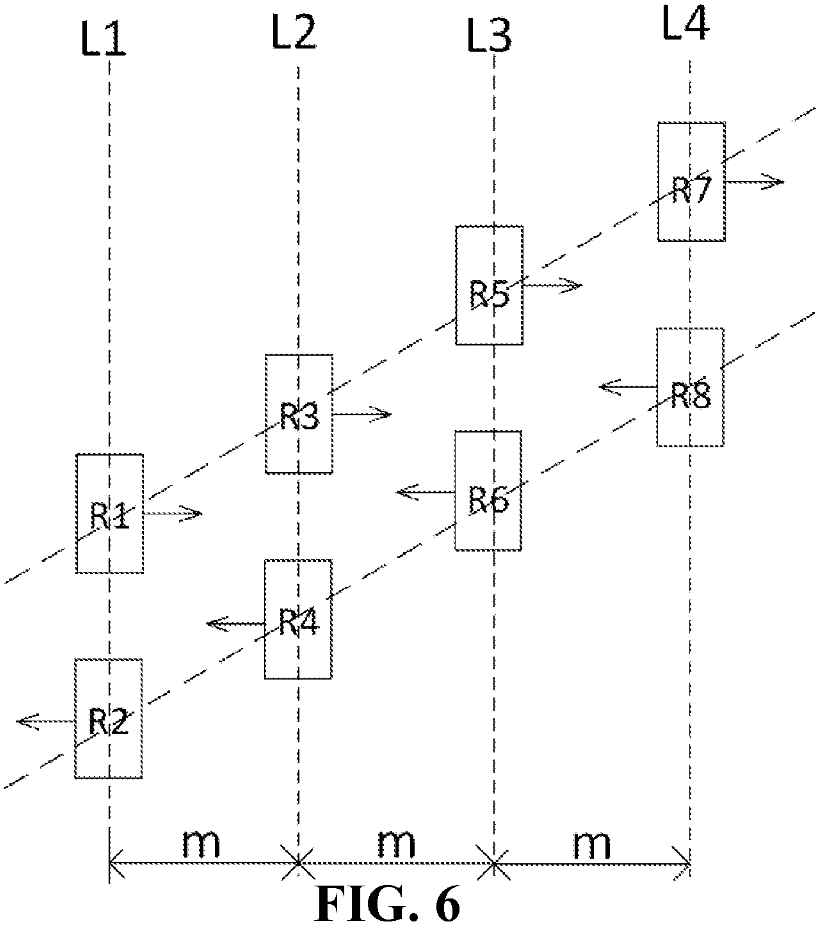
FIG. 6 is a schematic diagram of the positions of magneto-resistors in yet another current measurement device provided by an embodiment of the present invention.

Refer to FIG. 6, which is a schematic diagram of the positions of the magneto-resistors in yet another current measurement device provided by an embodiment of the present invention.

As shown in FIG. 6, the four different positions of the current measurement device can be denoted as L1, L2, L3 and L4 in sequence. The position L1 is provided with at least two magneto-resistors R1 and R2, the position L2 is provided with at least two magneto-resistors R3 and R4, the position L3 is provided with at least two magneto-resistors R5 and R6, and the position L4 is provided with at least two magneto-resistors R7 and R8. The magnetic field generated by the current at the position L1 is the same, the magnetic field generated by the current at the position L2 is the same, the magnetic field generated by the current at the position L3 is the same, the magnetic field generated by the current at the position L4 is the same, and the magnetic fields generated by the current at different positions are different. The sensitive directions of the magneto-resistors R1 and R2 located at the same position are opposite, the sensitive directions of the magneto-resistors R3 and R4 are opposite, the sensitive directions of the magneto-resistors R5 and R6 are opposite, and the sensitive directions of the magneto-resistors R7 and R8 are opposite.

The physical positions and reference directions of the magneto-resistors in the current measurement device are shown in FIG. 6. Wherein, the sensitive directions of the magneto-resistor R1, R3, R5 and R7 are the same, the sensitive directions of the magneto-resistor R2, R4, R6 and R8 are the same, and the sensitive directions of R1 and R2 are opposite. It can be understood that the sensitive directions of the magneto-resistors intersect with the arrangement direction of the positions of the magneto-resistors.

Optionally, the spacings between the positions L1 and L2, the positions L2 and L3, and the positions L3 and L4 are the same. For example, they are all m.

Figure 7:
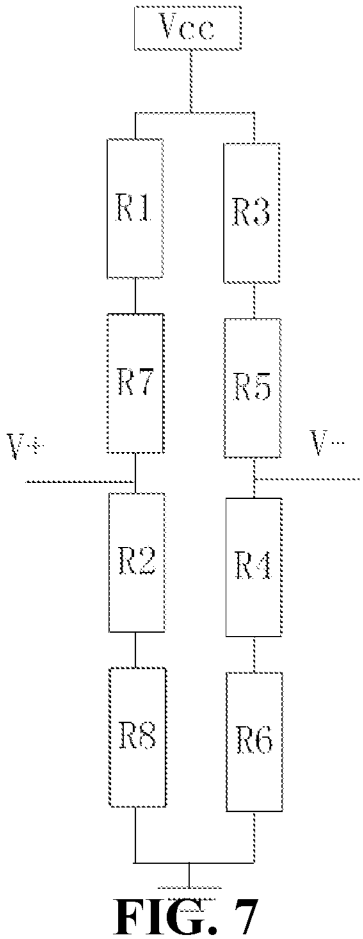
FIG. 7 is a schematic diagram of an anti-interference bridge structure in still another current measurement device provided by an embodiment of the present invention.

Optionally, the resistor network formed by eight magneto-resistors has two half-bridge structures. Refer to FIG. 7, which is a schematic diagram of an anti-interference bridge structure in yet another current measurement device provided by an embodiment of the present invention.

As shown in FIG. 7, the resistor network has a power supply terminal Vcc, a ground terminal and an output terminal (V+ and V−). Wherein, R1 and R7 form an upper bridge arm of a first half-bridge structure, R2 and R8 form a lower bridge arm of the first half-bridge structure, R3 and R5 form an upper bridge arm of the second half-bridge structure, and R4 and R6 form a lower bridge arm of the second half-bridge structure. The output signal of the first half-bridge structure is V+, and the output signal of the second half-bridge structure is V−.

Similarly, assuming that the intensity of the current flowing into the current measurement device is I, the interference field existing in the sensitive direction can be considered as a combined field of the gradient interference magnetic field Hg (magnetic field changing per unit distance) and the uniform interference magnetic field Hu, then we can obtain:

$$R1 = R0 - aI - nHu,\ R2 = R0 + aI + nHu,$$
$$R3 = R0 - bI - n(Hu + Hg),\ R4 = R0 + bI + n(Hu + Hg),$$
$$R5 = R0 - cI - n(Hn + 2Hg),\ R6 = R0 + cI + n(Hu + 2Hg),$$
$$R7 = R0 - dI - n(Hu + 3Hg),\ R8 = R0 + dI + n(Hu + 3Hg),$$

Based on this, the expressions of the output signals V+ and V− of the two half-bridge structures can be obtained as follows, $$V+ = \frac{R2 + R8}{R1 + R2 + R7 + R8} \times Vcc = \frac{2R0 + (a + d)I + n(2Hu + 3Hg)}{4R0} \times Vcc$$

-continued $$V- = \frac{R4 + R6}{R3 + R4 + R5 + R6} \times Vcc = \frac{2R0 + (b + c)I + n(2Hu + 3Hg)}{4R0} \times Vcc.$$

Here, a first-order differential operation is made on V+ and V− to obtain the final output signal Vout as, $$Vout = (V+) - (V-) = \frac{(a + d - b - c)I}{4R0} \times Vcc.$$

Obviously, the final output signal Vout of the current measurement device eliminates the interference from the gradient interference magnetic field Hg and the uniform interference magnetic field Hu.

In other embodiments, further optionally, in the current measurement device, N is an odd number greater than or equal to 5. For the solution where the number N of the different positions is an odd number, each position is provided with two magneto-resistors, then the resistance values of the magneto-resistors R1-R2N at the N positions are:

Position 1: $R1=R0-aI-nHu,\ R2=R0+aI+nHu$

Position 2: $R3=R0-bI-n(Hu+Hg),\ R4=R0+bI+n(Hu+Hg)$

Position 3: $R5=R0-cI-n(Hu+2Hg),\ R6=R0+cI+n(Hu+2Hg)$

. . .

Position $N$: $R(2N-1),\ R(2N)$.

Wherein, R1, . . . , R(4N+1) form an upper bridge arm of a first half-bridge structure, R2, . . . , R(4N+2) form a lower bridge arm of the first half-bridge structure; R3, . . . , R(4N−1) form an upper bridge arm of a second half-bridge structure, and R4, . . . , R(4N) form a lower bridge arm of the second half-bridge structure. The differential output signal of the two half-bridge structures is a signal that eliminates the interference from the gradient interference magnetic field Hg and the uniform interference magnetic field Hu.

For example, if N=7, and each position is provided with two magneto-resistors, then the resistance values of the magneto-resistors R1-R14 at the 7 positions are:

Position 1: $R1=R0-aI-nHu,\ R2=R0+aI+nHu$

Position 2: $R3=R0-bI-n(Hu+Hg),\ R4=R0+bI+n(Hu+Hg)$

Position 3: $R5=R0-cI-n(Hu+2Hg),\ R6=R0+cI+n(Hu+2Hg)$

Position 4: $R7=R0-dI-n(Hu+3Hg),\ R8=R0+dI+n(Hu+3Hg)$

Position 5: $R9=R0-eI-n(Hu+4Hg),\ R10=R0+eI+n(Hu+4Hg)$

Position 6: $R11=R0-fI-n(Hu+5Hg),\ R12=R0+fI+n(Hu+5Hg)$

Position 7: $R13=R0-gI-n(Hu+6Hg),\ R14=R0+gI+n(Hu+6Hg)$.

Wherein, R1, R5, R9 and R13 form an upper bridge arm of the first half-bridge structure, R2, R6, R10 and R14 form a lower bridge arm of the first half-bridge structure; R3, R7 and R11 form an upper bridge arm of a second half-bridge structure, and R4, R8 and R12 form a lower bridge arm of the second half-bridge structure.

Then, the expressions of the output signals V+ and V− of the two half-bridge structures are as follows, $$V+=\frac{R2+R6+R10+R14}{R1+R2+R5+R6+R9+R10+R13+R14}\times Vcc=\frac{4R0+(a+c+e+g)I+n(4Hu+12Hg)}{8R0}\times Vcc$$

$$V-=\frac{R4+R8+R12}{R3+R4+R7+R8+R11+R12}\times Vcc=\frac{3R0+(b+d+f)I+n(3Hu+9Hg)}{6R0}\times Vcc.$$

Here, a first-order differential operation is made on V+ and V− to obtain the final output signal Vout as, $$Vout=(V+)-(V-)=\left(\frac{a+c+e+g}{8R0}-\frac{b+d+f}{6R0}\right)\times I\times Vcc,$$

Obviously, the final output signal Vout of the current measurement device eliminates the interference from the gradient interference magnetic field Hg and the uniform interference magnetic field Hu.

In other embodiments, further optionally, in the current measurement device, N is an even number greater than or equal to 5. For the solution where the number N of the different positions is an even number, each position is provided with two magneto-resistors.

For example, if N=6, and each position is provided with two magneto-resistors, then the resistance values of the magneto-resistors R1-R12 at the 6 positions are:

Position 1: $R1=R0-aI-nHu$, $R2=R0+aI+nHu$

Position 2: $R3=R0-bI-n(Hu+Hg)$, $R4=R0+bI+n(Hu+Hg)$

Position 3: $R5=R0-cI-n(Hu+2Hg)$, $R6=R0+cI+n(Hu+2Hg)$

Position 4: $R7=R0-dI-n(Hu+3Hg)$, $R8=R0+dI+n(Hu+3Hg)$

Position 5: $R9=R0-eI-n(Hu+4Hg)$, $R10=R0+eI+n(Hu+4Hg)$

Position 6: $R11=R0-fI-n(Hu+5Hg)$, $R12=R0+fI+n(Hu+5Hg)$.

The magneto-resistors R1-R12 at the six positions can form a half-bridge structure of different solutions.

In the first solution, R1, R3, R9 and R11 are the upper bridge arm of the first half-bridge structure, R2, R4, R10 and R12 are the lower bridge arm of the first half-bridge structure; R5 and R7 are the upper bridge arm of the second half-bridge structure, and R6 and R8 are the lower bridge arm of the second half-bridge structure.

Then, the expressions of the output signals V+ and V− of the two half-bridge structures are as follows, $$V+=\frac{R2+R4+R10+R12}{R1+R2+R3+R4+R9+R10+R11+R12}\times Vcc=\frac{4R0+(a+b+e+f)I+n(4Hu+10Hg)}{8R0}\times Vcc$$

-continued $$V-=\frac{R6+R8}{R5+R6+R7+R8}\times Vcc=\frac{2R0+(c+d)I+n(2Hu+5Hg)}{4R0}\times Vcc.$$

Here, a first-order differential operation is made on V+ and V− to obtain the final output signal Vout, which eliminates the interference from the gradient interference magnetic field Hg and the uniform interference magnetic field Hu.

In the second solution, R1 and R11 are the upper bridge arm of the first half-bridge structure, R2 and R12 are the lower bridge arm of the first half-bridge structure; R3, R5, R7 and R9 are the upper bridge arm of the second half-bridge structure, and R4, R6, R8 and R10 are the lower bridge arm of the second half-bridge structure.

Then, the expressions of the output signals V+ and V− of the two half-bridge structures are as follows, $$V+=\frac{R2+R12}{R1+R2+R11+R12}\times Vcc=\frac{2R0+(a+f)I+n(2Hu+5Hg)}{4R0}\times Vcc$$

$$V-=\frac{R4+R6+R8+R10}{R3+R4+R5+R6+R7+R8+R9+R10}\times Vcc=\frac{4R0+(b+c+d+e)I+n(4Hu+10Hg)}{8R0}\times Vcc.$$

Here, a first-order differential operation is made on V+ and V− to obtain the final output signal Vout, which eliminates the interference from the gradient interference magnetic field Hg and the uniform interference magnetic field Hu.

For example, N=8, and each position is provided with two magneto-resistors, then the resistance values of the magneto-resistors R1-R16 at the eight positions are:

Position 1: $R1=R0-aI-nHu$, $R2=R0+aI+nHu$

Position 2: $R3=R0-bI-n(Hu+Hg)$, $R4=R0+bI+n(Hu+Hg)$

Position 3: $R5=R0-cI-n(Hu+2Hg)$, $R6=R0+cI+n(Hu+2Hg)$

Position 4: $R7=R0-dI-n(Hu+3Hg)$, $R8=R0+dI+n(Hu+3Hg)$

Position 5: $R9=R0-eI-n(Hu+4Hg)$, $R10=R0+eI+n(Hu+4Hg)$

Position 6: $R11=R0-fI-n(Hu+5Hg)$, $R12=R0+fI+n(Hu+5Hg)$

Position 7: $R13=R0-gI-n(Hu+6Hg)$, $R14=R0+gI+n(Hu+6Hg)$

Position 8: $R15=R0-hI-n(Hu+7Hg)$, $R16=R0+hI+n(Hu+7Hg)$.

The magneto-resistors R1-R16 at the eight positions can form two half-bridge structures. Wherein, R1, R3, R13 and R15 are the upper bridge arm of the first half-bridge structure, R2, R4, R14, R16 are the lower bridge arm of the first half-bridge structure; R5, R7, R9 and R11 are the upper bridge arm of the second half-bridge structure, and R6, R8, R10 and R12 are the lower bridge arm of the second half-bridge structure.

Then, the expressions of the output signals V+ and V− of the two half-bridge structures are as follows, $$\mathrm{V}+=\frac{R2+R4+R14+R16}{R1+R2+R3+R4+R13+R14+R15+R16}\times \mathrm{V}cc=\frac{4R0+(a+b+g+h)I+n(4Hu+14Hg)}{8R0}\times \mathrm{V}cc$$

$$\mathrm{V}-=\frac{R6+R8+R10+R12}{R5+R6+R7+R8+R9+R10+R11+R12}\times \mathrm{V}cc=\frac{4R0+(c+d+e+f)I+n(4Hu+14Hg)}{8R0}\times \mathrm{V}cc.$$

Here, a first-order differential operation is made on V+ and V− to obtain the final output signal Vout as, $$\mathrm{V}out=(\mathrm{V}+)-(\mathrm{V}-)=\left(\frac{a+c+e+g}{8R0}-\frac{b+d+f}{6R0}\right)\times I\times \mathrm{V}cc,$$

As such, the interference from the gradient interference magnetic field Hg and the uniform interference magnetic field Hu is eliminated.

There is no general formula for the case where the number N of the different positions is an even number. Any solution where at least two half-bridge structures are formed using magneto-resistors at multiple positions so that the signal components of the gradient interference magnetic field Hg and the uniform interference magnetic field Hu cancel each other out shall fall within the protection scope of the present invention.

In the electrical current measurement device provided by embodiments of the present invention, an anti-interference bridge structure is provided without introducing other components, and the magneto-resistor output eliminates the influence of both the gradient interference magnetic field and the uniform interference magnetic field, improving the detection accuracy and being suitable for a variety of application scenarios.

It can be understood that in multiple embodiments of the present invention, merely a specific direction, such as the horizontal direction, is selected as the sensitive direction of the magneto-resistor as an example. However, in actual production, the sensitive direction of the magneto-resistor may be any direction, provided that the magnetic field induced by the current to be measured has a magnetic field component in the selected sensitive direction of the magneto-resistor.

It is noted that described above are only the preferred embodiments of the present invention and the technical principles used. Those skilled in the art understand that the present invention is not limited to the specific embodiments described herein, and that various obvious changes, readjustments, mutual combinations and substitutions can be made to those skilled in the art without departing from the protection scope of the present invention. Therefore, although the present invention has been described in detail with the above embodiments, the present invention is not limited to the above embodiments. Without departing from the concept of the present invention, more other equivalent embodiments can also be included, and the scope of the present invention is defined by the following claims.

The invention claimed is:

1. A current measurement device, comprising N different positions, wherein each position is provided with at least two magneto-resistors, N being greater than or equal to 3;

the two magneto-resistors at the same position comprise a magneto-resistor with a first sensitive direction and a magneto-resistor with a second sensitive direction, the first sensitive direction and the second sensitive direction are opposite, and the resistance value of the magneto-resistor, within a set range, has a linear relationship with the magnetic field at the position where the magneto-resistor is located;

the sensitive directions of all the magneto-resistors at the N different positions are the same or opposite, and the magnetic field to be measured has a respective component in the sensitive direction at each of the N different positions;

the magnitude of the component, in the sensitive direction, of the magnetic field to be measured at least one of the N positions differs from the magnitude of the component, in the sensitive direction, of the magnetic field to be measured at each of the remaining positions; and all the magneto-resistors are electrically connected to form a resistor network, an output signal of the resistor network comprises the signal of the magnetic field to be measured and comprises an interference magnetic field signal having an intensity less than a first preset threshold intensity, wherein the first preset threshold intensity is a minimum intensity value below which the interference magnetic field signal is considered negligible, and the interference magnetic field signal comprises at least one of a uniform interference magnetic field component or a gradient interference magnetic field component.

2. The current measurement device according to claim 1, wherein the N different positions are distributed on the same straight line.

3. The current measurement device according to claim 1, wherein the N different positions are distributed to be equally spaced.

4. The current measurement device according to claim 1, wherein the resistor network has a power supply terminal, a ground terminal and an output terminal.

5. The current measurement device according to claim 4, wherein the structure of the resistor network comprises at least two half-bridge structures, the half-bridge structure is formed by an upper bridge arm and a lower bridge arm, one terminal of the upper bridge arm is electrically connected to the power supply terminal, one terminal of the lower bridge arm is electrically connected to the ground terminal, and the other terminal of the upper bridge arm and the other terminal of the lower bridge arm are both electrically connected to the output terminal; and, in any of the half-bridge structures, the magneto-resistor in the upper bridge arm comprises magneto-resistors at one or more positions, and the magneto-resistors in the upper bridge arm have the same sensitive direction, and the magneto-resistor in the lower bridge arm comprises magneto-resistors at one or more positions, and the magneto-resistors in the lower bridge arm have the same sensitive direction, and the sensitive direction of the magneto-resistors in the upper bridge arm is different from that of the magneto-resistors in the lower bridge arm.

6. The current measurement device according to claim 5, further comprising:

a current wire that generates a magnetic field to be measured to reflect the magnitude and direction of the current in the current wire, wherein the structure of the resistor network is used to enable an output signal of the resistor network to comprise the signal of the magnetic field to be measured and not comprise or comprise an interference magnetic field signal less than a first preset intensity, so that the current measurement device reflects the magnitude and direction of the current in the current wire without being influenced by the interference magnetic field.

7. The current measurement device according to claim 6, wherein N is 3, and the N different positions are a first position, second position and third position in sequence;

some magneto-resistors at the first position and the third position are electrically connected to form an upper bridge arm of a first half-bridge structure;

the other magneto-resistors at the first position and the third position are electrically connected to form a lower bridge arm of the first half-bridge structure;

some magneto-resistors at the second position are electrically connected to form an upper bridge arm of the second half-bridge structure;

the other magneto-resistors at the second position are electrically connected to form a lower bridge arm of the second half-bridge structure; and an output terminal signal of the first half-bridge structure and an output terminal signal of the second half-bridge structure are combined to reflect the magnitude and direction of the current in the current wire.

8. The current measurement device according to claim 6, wherein N is 3, and the N different positions are a first position, second position and third position in sequence;

some magneto-resistors at the first position are electrically connected to form an upper bridge arm of a first half-bridge structure;

other magneto-resistors at the first position are electrically connected to form a lower bridge arm of the first half-bridge structure;

some magneto-resistors at the second position are electrically connected to form an upper bridge arm of the second half-bridge structure;

the other magneto-resistors at the second position are electrically connected to form a lower bridge arm of the second half-bridge structure; and some magneto-resistors at the third position are electrically connected to form an upper bridge arm of the third half-bridge structure;

other magneto-resistors at the third position are electrically connected to form a lower bridge arm of the third half-bridge structure; and an output terminal signal of the first half-bridge structure, an output terminal signal of the second half-bridge structure, and an output terminal signal of the third half-bridge structure are combined to reflect the magnitude and direction of the current in the current wire.

9. The current measurement device according to claim 6, wherein N is 4, and the N different positions are a first position, second position, third position and fourth position in sequence;

the magneto-resistors at the first position and the fourth position are electrically connected to form an upper bridge arm of a first half-bridge structure;

the magneto-resistors at the first position and the fourth position are electrically connected to form a lower bridge arm of the first half-bridge structure;

the magneto-resistors at the second position and the third position are electrically connected to form an upper bridge arm of a second half-bridge structure;

the magneto-resistors at the second position and the third position are electrically connected to form a lower bridge arm of the second half-bridge structure; and an output terminal signal of the first half-bridge structure and an output terminal signal of the second half-bridge structure are combined to reflect the magnitude and direction of the current in the current wire.

10. The current measurement device according to claim 7, wherein the form of electrical connection in which the magneto-resistors are electrically connected to form the half-bridge structure is a series electrical connection and/or a parallel electrical connection.

* * * * *